US012608061B2

(12) United States Patent
Deo et al.

(10) Patent No.: US 12,608,061 B2
(45) Date of Patent: Apr. 21, 2026

(54) SYSTEMS AND METHODS FOR COMPUTING ACCURATE LOAD IMPEDANCE IN THE PRESENCE OF MEASUREMENT ACCURACY-REDUCING EVENTS

(71) Applicant: Cirrus Logic International Semiconductor Ltd., Edinburgh (GB)

(72) Inventors: Sachin Deo, Austin, TX (US); Nariankadu Hemkumar, Austin, TX (US); Mark May, Austin, TX (US); Akhilesh Persha, Austin, TX (US); Eric B. Smith, Austin, TX (US); Donelson A. Shannon, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 466 days.

(21) Appl. No.: 18/469,101

(22) Filed: Sep. 18, 2023

(65) Prior Publication Data

US 2025/0093922 A1    Mar. 20, 2025

(51) Int. Cl.
*G06F 1/26* (2006.01)
*G01R 27/08* (2006.01)

(52) U.S. Cl.
CPC .............. *G06F 1/26* (2013.01); *G01R 27/08* (2013.01)

(58) Field of Classification Search
CPC ..... G06F 1/26; B26D 2007/322; B26D 3/003; B26D 5/20; B26D 7/086; B26D 7/14; B26D 7/26; B65H 23/044; B65H 23/048; G01R 27/08; G01R 31/2829; G03B 2205/0053; G03B 5/00; H04N 23/687
USPC ........................................ 700/73
See application file for complete search history.

(56) References Cited

U.S. PATENT DOCUMENTS

| | | | |
|---|---|---|---|
| 2006/0162332 A1 | 7/2006 | Klaffenback et al. | |
| 2018/0367897 A1* | 12/2018 | Bjork ................... | H04R 29/001 |
| 2019/0120214 A1 | 4/2019 | Brown et al. | |
| 2019/0379389 A1* | 12/2019 | Parupalli .............. | H04N 23/667 |
| 2021/0063454 A1* | 3/2021 | Takahashi .............. | G01R 27/14 |

(Continued)

FOREIGN PATENT DOCUMENTS

WO        2012005072 A1      1/2012

OTHER PUBLICATIONS

Combined Search and Examination Report under Sections 17 and 18(3), UKIPO, Application No. GB2413260.7, mailed Feb. 18, 2025.

*Primary Examiner* — Chun Cao
(74) *Attorney, Agent, or Firm* — Jackson Walker L.L.P.

(57) ABSTRACT

A system may include a first controller and a second controller communicatively coupled to the first controller via a bidirectional communication channel and configured to drive a load in accordance with a target current signal, sample a load voltage of the load at a sample rate substantially slower than a time duration of electrical transients of the load, calculate a resistance of the load based on a current signal and the load voltage and communicate information indicative of the resistance to the first controller at a time interval substantially slower than the time duration of electrical transients of the load, detect when one or more accuracy-reducing events associated with the system occur, wherein an accuracy-reducing event is one which negatively affects accuracy of calculation of the resistance, and modify the information provided to the first controller when one or more accuracy-reducing events occur.

38 Claims, 5 Drawing Sheets

(56) References Cited

U.S. PATENT DOCUMENTS

2021/0174777 A1*  6/2021  Marchais ................. G10K 9/13
2024/0334057 A1*  10/2024  Park ...................... H04N 23/57

* cited by examiner

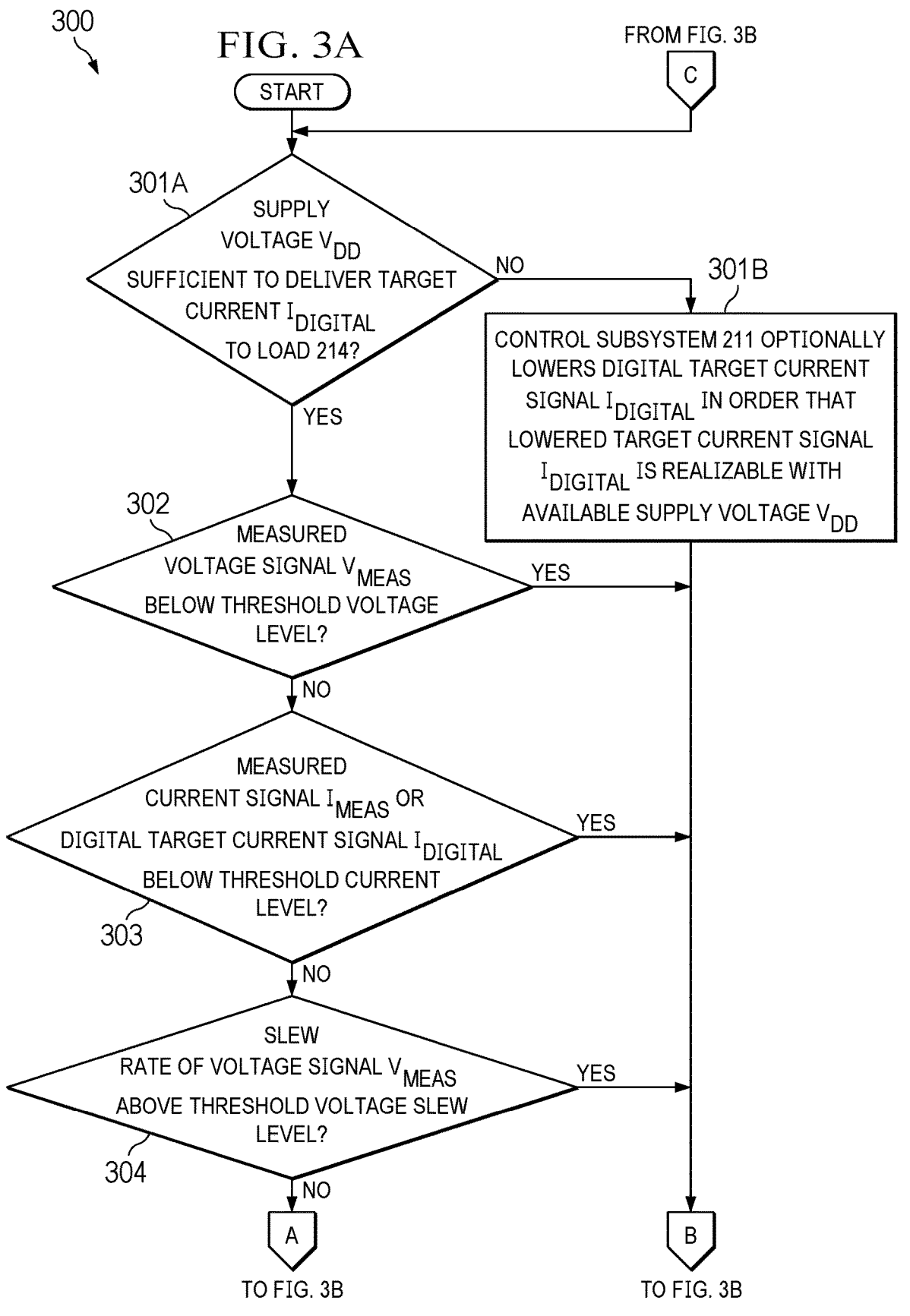

FROM FIG. 3B
C

START

301A
SUPPLY VOLTAGE $V_{DD}$ SUFFICIENT TO DELIVER TARGET CURRENT $I_{DIGITAL}$ TO LOAD 214?

NO →

301B
CONTROL SUBSYSTEM 211 OPTIONALLY LOWERS DIGITAL TARGET CURRENT SIGNAL $I_{DIGITAL}$ IN ORDER THAT LOWERED TARGET CURRENT SIGNAL $I_{DIGITAL}$ IS REALIZABLE WITH AVAILABLE SUPPLY VOLTAGE $V_{DD}$

YES

302
MEASURED VOLTAGE SIGNAL $V_{MEAS}$ BELOW THRESHOLD VOLTAGE LEVEL?

YES →

NO

MEASURED CURRENT SIGNAL $I_{MEAS}$ OR DIGITAL TARGET CURRENT SIGNAL $I_{DIGITAL}$ BELOW THRESHOLD CURRENT LEVEL?
303

YES →

NO

SLEW RATE OF VOLTAGE SIGNAL $V_{MEAS}$ ABOVE THRESHOLD VOLTAGE SLEW LEVEL?
304

YES →

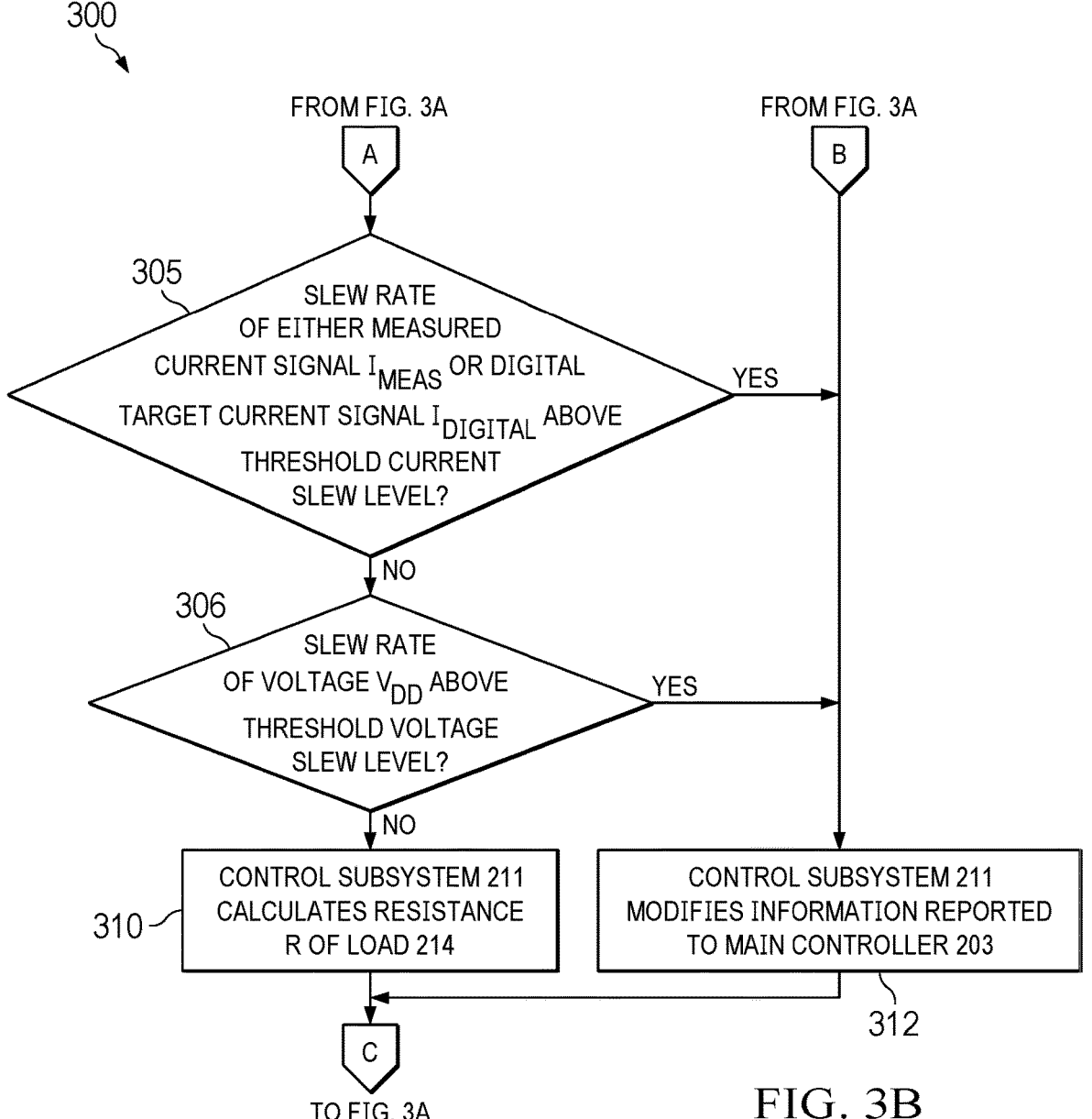

300

FROM FIG. 3A                                                    FROM FIG. 3A

A                                                                      B

305

SLEW RATE
OF EITHER MEASURED
CURRENT SIGNAL I$_{MEAS}$ OR DIGITAL
TARGET CURRENT SIGNAL I$_{DIGITAL}$ ABOVE
THRESHOLD CURRENT
SLEW LEVEL?                                    YES

NO

306

SLEW RATE
OF VOLTAGE V$_{DD}$ ABOVE
THRESHOLD VOLTAGE
SLEW LEVEL?                          YES

NO

CONTROL SUBSYSTEM 211                    CONTROL SUBSYSTEM 211
CALCULATES RESISTANCE                MODIFIES INFORMATION REPORTED
R OF LOAD 214                           TO MAIN CONTROLLER 203

SYSTEMS AND METHODS FOR COMPUTING ACCURATE LOAD IMPEDANCE IN THE PRESENCE OF MEASUREMENT ACCURACY-REDUCING EVENTS

FIELD OF DISCLOSURE

The present disclosure relates in general to electronic devices, and more particularly, to a flexible approach to computing accurate load impedance in the presence of measurement accuracy-reducing events.

BACKGROUND

Many traditional mobile devices (e.g., mobile phones) include one or more cameras for capturing images. To provide for image stabilization and focus, a position of a camera within a plane substantially parallel to a subject of an image as well as a position of a lens of the camera in a direction perpendicular to such plane, may be controlled by a plurality of motors under the control of a camera controller. A control system may be implemented using an applications processor of the mobile device coupled via a communication interface (e.g., an Inter-Integrated Circuit or I2C interface) to a camera controller local to the camera and its various motors. For example, the applications processor may communicate to the camera controller a vector of data regarding a target position for the camera, whereas the camera controller may communicate to the applications processor a vector regarding an actual position of the camera, as sensed by a plurality of magnetic sensors (e.g., Hall sensors) and/or other appropriate sensors.

A camera controller may receive a number of disparate-rate data streams and sub-streams, which it must manage and deliver to other processing components for processing of data in order to control components (e.g., motors) of the camera. Other control systems, including those used in devices other than for cameras, may also receive a number of disparate-rate data streams and sub-streams, which must also be managed and delivered to other processing components for processing of data in order to provide control of one or more components. Among such disparate-rate data streams and sub-streams may be measurements of current and voltage of a load (e.g., a voice coil motor) associated with the camera control. Such asynchronous measurements of current and voltage may present challenges in accurately computing impedance of the load, which may be required for control of such load.

SUMMARY

In accordance with the teachings of the present disclosure, the disadvantages and problems associated with measurement of impedance of a load in certain systems that experience measurement accuracy-reducing events may be reduced or eliminated.

In accordance with embodiments of the present disclosure, a system may include a first controller and a second controller communicatively coupled to the first controller via a bidirectional communication channel and configured to drive a load in accordance with a target current signal, sample a load voltage of the load at a sample rate substantially slower than a time duration of electrical transients of the load, calculate a resistance of the load based on a current signal and the load voltage and communicate information indicative of the resistance to the first controller at a time interval substantially slower than the time duration of electrical transients of the load, detect when one or more accuracy-reducing events associated with the system occur, wherein an accuracy-reducing event is one which negatively affects accuracy of calculation of the resistance, and modify the information provided to the first controller when one or more accuracy-reducing events occur.

In accordance with these and other embodiments of the present disclosure, a method is provided for a system comprising a first controller and a second controller communicatively coupled to the first controller via a bidirectional communication channel. The method may include, by the second controller, driving a load in accordance with a target current signal, sampling a load voltage of the load at a sample rate substantially slower than a time duration of electrical transients of the load, calculating a resistance of the load based on a current signal and the load voltage and communicate information indicative of the resistance to the first controller at a time interval substantially slower than the time duration of electrical transients of the load, detecting when one or more accuracy-reducing events associated with the system occur, wherein an accuracy-reducing event is one which negatively affects accuracy of calculation of the resistance, and modifying the information provided to the first controller when one or more accuracy-reducing events occur.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIGS. 3A and 3B (which may be collectively referred to herein as "FIG. 3") illustrate a flow chart of an example method for computing accurate load resistance in the control system of FIG. 2, in accordance with embodiments of the present disclosure.

DETAILED DESCRIPTION

Figure 1:
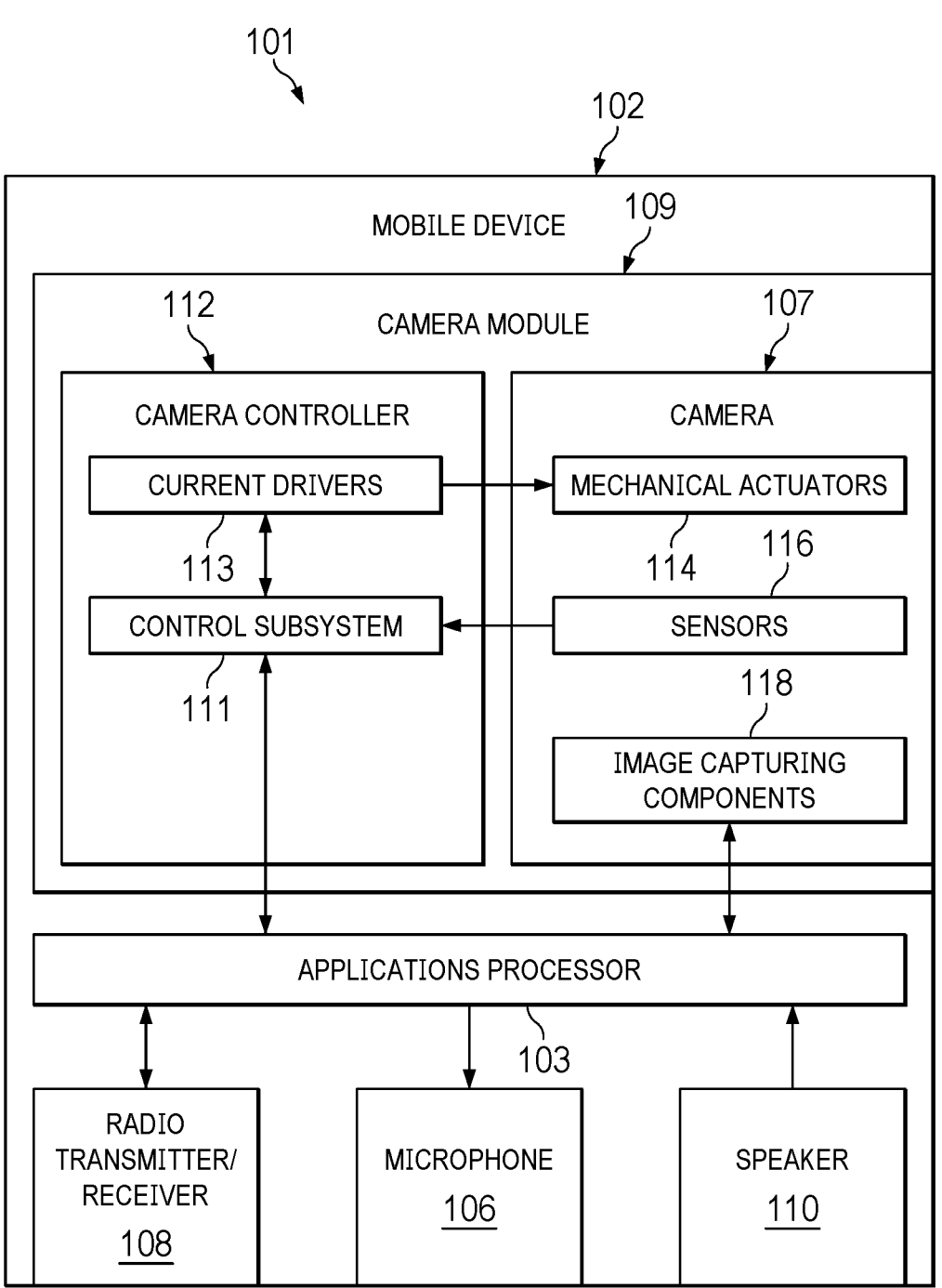
FIG. 1 illustrates a block diagram of selected components of an example mobile device, in accordance with embodiments of the present disclosure.

FIG. 1 illustrates a block diagram of selected components of an example mobile device 101, in accordance with embodiments of the present disclosure. As shown in FIG. 1, mobile device 101 may comprise an enclosure 102, an applications processor 103, a microphone 106, a radio transmitter/receiver 108, a speaker 110, and a camera module 109 comprising a camera 107 and a camera controller 112.

Enclosure 102 may comprise any suitable housing, casing, or other enclosure for housing the various components of mobile device 101. Enclosure 102 may be constructed from plastic, metal, and/or any other suitable materials. In addition, enclosure 102 may be adapted (e.g., sized and shaped) such that mobile device 101 is readily transported on a person of a user of mobile device 101. Accordingly, mobile device 101 may include but is not limited to a smart phone, a tablet computing device, a handheld computing device, a personal digital assistant, a notebook computer, a video game controller, or any other device that may be readily transported on a person of a user of mobile device 101.

Applications processor 103 may be housed within enclosure 102 and may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, applications processor 103 may interpret and/or execute program instructions and/or process data stored in a memory (not explicitly shown) and/or other computer-readable media accessible to applications processor 103.

Microphone 106 may be housed at least partially within enclosure 102, may be communicatively coupled to applications processor 103, and may comprise any system, device, or apparatus configured to convert sound incident at microphone 106 to an electrical signal that may be processed by applications processor 103, wherein such sound is converted to an electrical signal using a diaphragm or membrane having an electrical capacitance that varies based on sonic vibrations received at the diaphragm or membrane. Microphone 106 may include an electrostatic microphone, a condenser microphone, an electret microphone, a microelectromechanical systems (MEMs) microphone, or any other suitable capacitive microphone.

Radio transmitter/receiver 108 may be housed within enclosure 102, may be communicatively coupled to applications processor 103, and may include any system, device, or apparatus configured to, with the aid of an antenna, generate and transmit radio-frequency signals as well as receive radio-frequency signals and convert the information carried by such received signals into a form usable by applications processor 103. Radio transmitter/receiver 108 may be configured to transmit and/or receive various types of radio-frequency signals, including without limitation, cellular communications (e.g., 2G, 3G, 4G, LTE, etc.), short-range wireless communications (e.g., BLUETOOTH), commercial radio signals, television signals, satellite radio signals (e.g., GPS), Wireless Fidelity, etc.

Speaker 110 may be housed at least partially within enclosure 102 or may be external to enclosure 102, may be communicatively coupled to applications processor 103, and may comprise any system, device, or apparatus configured to produce sound in response to electrical audio signal input. In some embodiments, speaker 110 may comprise a dynamic loudspeaker, which employs a lightweight diaphragm mechanically coupled to a rigid frame via a flexible suspension that constrains a voice coil to move axially through a magnetic gap. When an electrical signal is applied to the voice coil, a magnetic field is created by the electric current in the voice coil, making it a variable electromagnet. The voice coil and the driver's magnetic system interact, generating a mechanical force that causes the voice coil (and thus, the attached cone) to move back and forth, thereby reproducing sound under the control of the applied electrical signal coming from the amplifier.

Camera 107 may be housed at least partially within enclosure 102 (and partially outside of enclosure 102, to enable light to enter a lens of camera 107), and may include any suitable system, device, or apparatus for recording images (moving or still) into one or more electrical signals that may be processed by applications processor 103. As shown in FIG. 1, camera 107 may include a plurality of mechanical actuators 114, sensors 116, and image capturing components 118.

Image capturing components 118 may include a collection of components configured to capture an image, including without limitation one or more lenses and image sensors for sensing intensities and wavelengths of received light. Such image capturing components 118 may be coupled to applications processor 103 such that camera 107 may communicate captured images to applications processor 103.

Mechanical actuators 114 may be mechanically coupled to one or more of image capturing components 118, and each mechanical actuator 114 may include any suitable system, device, or apparatus configured to, based on current signals received from camera controller 112 indicative of a desired camera position, cause mechanical motion of such one or more image capturing components 118 to a desired camera position. An example of a mechanical actuator 114 is a motor.

Sensors 116 may be mechanically coupled to one or more of image capturing components 118 and/or mechanical actuators 114 and may be configured to sense a position associated with camera 107. For example, a first sensor 116 may sense a first position (e.g., x-position) of camera 107 with respect to a first linear direction, a second sensor 116 may sense a second position (e.g., y-position) of camera 107 with respect to a second linear direction normal to the first linear direction, and a third sensor 116 may sense a third position (e.g., z-position) of camera 107 (e.g., position of lens) with respect to a third linear direction normal to the first linear direction and the second linear direction.

Camera controller 112 may be housed within enclosure 102, may be communicatively coupled to camera 107 and applications processor 103 (e.g., via an Inter-Integrated Circuit (I2C) interface), and may include any system, device, or apparatus configured to control mechanical actuators 114 or other components of camera 107 to place components of camera 107 into a desired position. Camera controller 112 may also be configured to receive signals from sensors 116 regarding an actual position of camera 107 and/or regarding a status of camera 107. As shown in FIG. 1, camera controller 112 may include a control subsystem 111 and current drivers 113.

Control subsystem 111 may be integral to camera controller 112, and may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, control subsystem 111 may interpret and/or execute program instructions and/or process data stored in a memory and/or other computer-readable media accessible to control subsystem 111. Specifically, control subsystem 111 may be configured to perform functionality of camera controller 112, including but not limited to control of mechanical actuators 114 and receipt and processing of data from sensors 116.

Current drivers 113 may comprise a plurality of circuits, each such circuit configured to receive one or more control signals from control subsystem 111 (including without limitation a signal indicative of a desired target current for a mechanical actuator 114) and drive a current-mode signal to a respective mechanical actuator 114 in accordance with the one or more control signals in order to control operation of such respective mechanical actuator 114.

Figure 2:
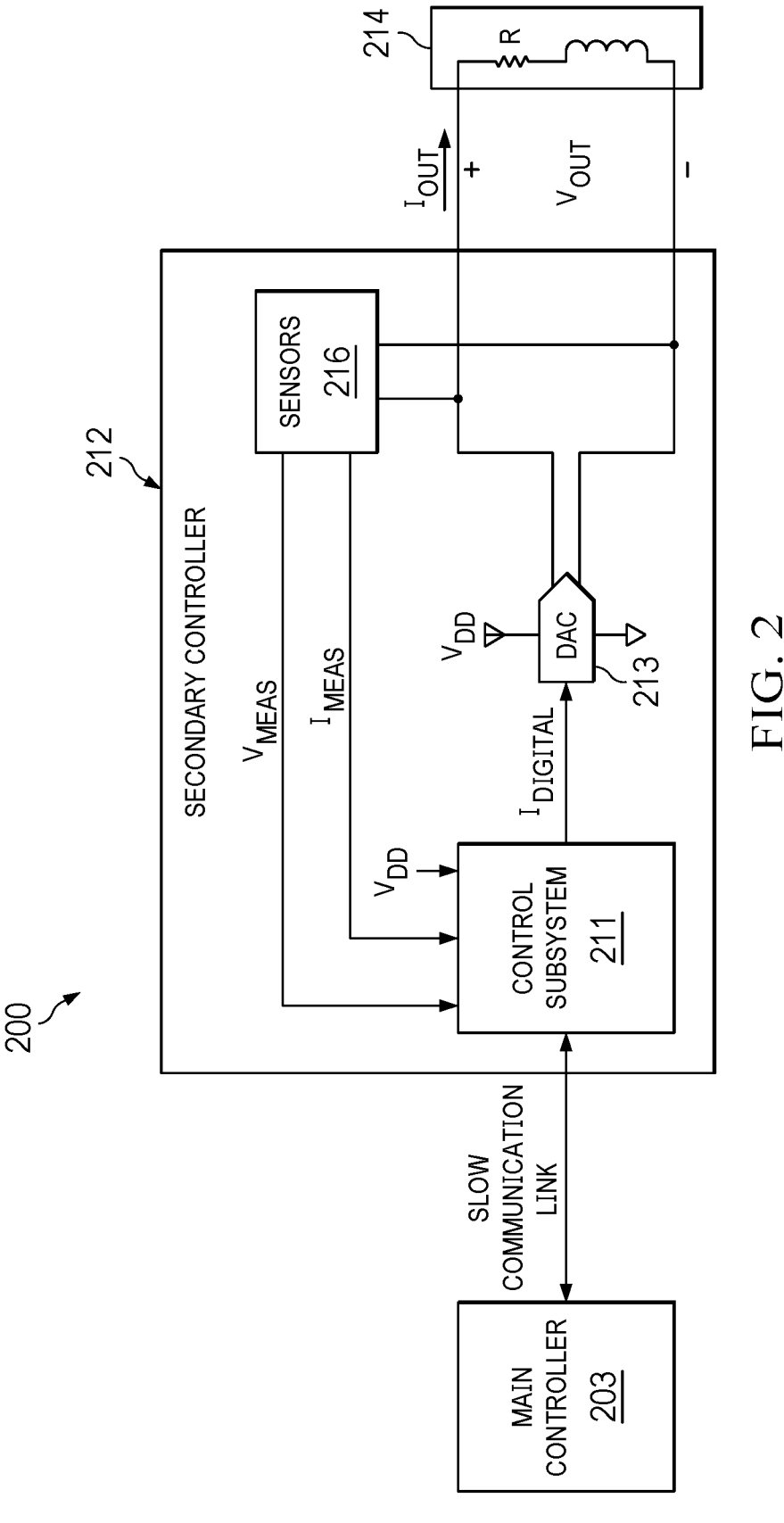
FIG. 2 illustrates a block diagram of selected components of a control system, in accordance with embodiments of the present disclosure.

FIG. 2 illustrates a block diagram of selected components of a control system 200, in accordance with embodiments of the present disclosure. As shown in FIG. 2, control system 200 may include main controller 203, secondary controller 212, and a load 214. In some embodiments, control system 200 may implement all or a part of camera module 109. For example, in such embodiments, main controller 203 may implement applications processor 103, secondary controller 212 may implement camera controller 112, and load 214 may implement a mechanical actuator 114.

Main controller 203 may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, main controller 203 may interpret and/or execute program instructions and/or process data stored in a memory (not explicitly shown) and/or other computer-readable media accessible to main controller 203.

Secondary controller 212 may be communicatively coupled to main controller 203 via a bidirectional communication channel, and may comprise any suitable system, device, or apparatus configured to drive an output current $I_{OUT}$ to load 214 to cause an output voltage $V_{OUT}$ across load 214. As shown in FIG. 2, secondary controller 212 may include a control subsystem 211 (which may implement control subsystem 111), a digital-to-analog converter (DAC) 213 (which may implement at least a portion of current drivers 113), and sensor 216 (which may implement one or more of sensors 116). In operation, DAC 213 may convert a digital target current signal $I_{DIGITAL}$ received from control subsystem 211 into an analog current signal for driving output current $I_{OUT}$ to load 214 to cause output voltage $V_{OUT}$ across load 214. Sensors 216 may sense output voltage $V_{OUT}$ and generate a measured voltage signal $V_{MEAS}$ indicative of output voltage $V_{OUT}$. Further, sensors 216 may sense output current $I_{OUT}$ and generate a measured current signal $I_{MEAS}$ indicative of output current $I_{OUT}$.

Load 214 may comprise any electrical, electromechanical, and/or electromagnetic load.

In operation, control subsystem 211 may, based on measured voltage signal $V_{MEAS}$ and either of digital target current signal $I_{DIGITAL}$ and or a measured current signal $I_{MEAS}$, apply Ohm's law to calculate a resistance R (e.g., $R=V_{MEAS}/I_{DIGITAL}$ Or $R=V_{MEAS}/I_{MEAS}$) associated with load 214 (as described in greater detail below) and communicate such resistance R to main controller 203. However, secondary controller 212 may communicate such resistance R to main controller 203 at a time interval which is greater than a time duration of electrical transients across load 214. Further, the samples of output voltage $V_{OUT}$ measured by sensor 216 may also be taken at a time interval that is greater than a time duration of electrical transients across load 214.

Moreover, in some instances, measurements of output voltage $V_{OUT}$ may be asynchronous and thus non-instantaneous with digital target current signal $I_{DIGITAL}$. Thus, at times, the load transients, asynchronous measurements, and/or other system configurations may lead to accuracy-reducing events in the measurement of resistance, resulting in non-negligible errors in the resistance calculation computed and reported by control subsystem 211.

FIG. 3 illustrates a flow chart of an example method 300 for computing accurate load resistance in control system 200, in accordance with embodiments of the present disclosure. According to some embodiments, method 300 may begin at step 301A. As noted above, teachings of the present disclosure may be implemented in a variety of configurations of mobile device 101 and/or control system 200. As such, the preferred initialization point for method 300 and the order of the steps comprising method 300 may depend on the implementation chosen.

At step 301A, control subsystem 211 may determine if supply voltage $V_{DD}$ is sufficient to deliver target current $I_{DIGITAL}$ to load 214. If supply voltage $V_{DD}$ is insufficient to deliver target current $I_{DIGITAL}$ to load 214, method 300 may proceed to step 301B. Otherwise, method 300 may proceed to step 302.

At step 301B, control subsystem 211 may optionally lower digital target current signal $I_{DIGITAL}$ in order that the lowered target current signal $I_{DIGITAL}$ is realizable with available supply voltage $V_{DD}$. After completion of step 301B, method 300 may proceed to step 312.

At step 302, control subsystem 211 may determine if measured voltage signal $V_{MEAS}$ is below a threshold voltage level. A measured voltage signal $V_{MEAS}$ below the threshold voltage level may be too low to provide accurate resistance calculations. If measured voltage signal $V_{MEAS}$ is below the threshold voltage level, method 300 may proceed to step 312. Otherwise, method 300 may proceed to step 303.

At step 303, control subsystem 211 may determine if measured current signal $I_{MEAS}$ or digital target current signal $I_{DIGITAL}$ is below a threshold current level. A measured current signal $I_{MEAS}$ or digital target current signal $I_{DIGITAL}$ below the threshold current level may be too low to provide accurate resistance calculations. If measured current signal $I_{MEAS}$ or digital target current signal $I_{DIGITAL}$ is below a threshold current level, method 300 may proceed to step 312. Otherwise, method 300 may proceed to step 304.

At step 304, control subsystem 211 may determine if a rate of change over time or slew rate of measured voltage signal $V_{MEAS}$ is above a threshold voltage slew level. A slew rate of voltage signal $V_{MEAS}$ above the threshold voltage slew level may be too high to provide accurate resistance calculations. If the slew rate of measured voltage signal $V_{MEAS}$ is above the threshold voltage slew level, method 300 may proceed to step 312. Otherwise, method 300 may proceed to step 305.

At step 305, control subsystem 211 may determine if a rate of change over time or slew rate of either of measured current signal $I_{MEAS}$ or digital target current signal $I_{DIGITAL}$ is above a threshold current slew level. A slew rate of measured current signal $I_{MEAS}$ or digital target current signal $I_{DIGITAL}$ above the threshold current slew level may be too high to provide accurate resistance calculations. If the slew rate of either of measured current signal $I_{MEAS}$ or digital target current signal $I_{DIGITAL}$ is above a threshold current slew level, method 300 may proceed to step 312. Otherwise, method 300 may proceed to step 306.

At step 306, control subsystem 211 may determine if a rate of change over time or slew rate of a supply voltage $V_{DD}$ that supplies electrical energy to DAC 213 and/or other components of mobile device 101 is above a threshold voltage slew level. A slew rate of supply voltage $V_{DD}$ above the threshold voltage slew level may be too high to provide accurate resistance calculations. If the slew rate of measured voltage signal $V_{MEAS}$ is above the threshold voltage slew level, method 300 may proceed to step 312. Otherwise, method 300 may proceed to step 310.

At step 310, the magnitude of measured voltage signal $V_{MEAS}$, magnitude of measured current signal $I_{MEAS}$ and/or digital target current signal $I_{DIGITAL}$, the slew rate of measured voltage signal $V_{MEAS}$, the slew rate of measured current signal $I_{MEAS}$ and/or digital target current signal $I_{DIGITAL}$, the slew rate of supply voltage $V_{DD}$, and the magnitude of supply voltage $V_{DD}$ may be within acceptable ranges for providing accurate resistance calculations. Accordingly, control subsystem 211 may calculate resistance R of load 214 in accordance with Ohm's law and communicate such calculated value to main controller 203. After completion of step 310, method 300 may proceed again to step 301A.

At step 312, at least one of the parameters (e.g., magnitude of measured voltage signal $V_{MEAS}$, magnitude of measured current signal $I_{MEAS}$ and/or digital target current signal $I_{DIGITAL}$, the slew rate of measured voltage signal $V_{MEAS}$, the slew rate of measured current signal $I_{MEAS}$ and/or digital target current signal $I_{DIGITAL}$, the slew rate of supply voltage $V_{DD}$, and the magnitude of supply voltage $V_{DD}$) may be within an unacceptable range for providing accurate resistance calculations. Accordingly, control subsystem 211 may modify information it communicates in connection with the calculation of resistance R. Such information may include status flags or may include a modification of the calculation of resistance R. Examples of such modification of the calculation of resistance R may include control subsystem 211 reporting the previously calculated value for the calculation of resistance R to main controller 203, control subsystem 211 reporting a default value (e.g., zero) for resistance R to main controller 203, and/or control subsystem 211 modifying one or more status flags reported to main controller 203. After completion of step 312, method 300 may proceed again to step 301A.

Although FIG. 3 discloses a particular number of steps to be taken with respect to method 300, method 300 may be executed with greater or fewer steps than those depicted in FIG. 3. In addition, although FIG. 3 discloses a certain order of steps to be taken with respect to method 300, the steps comprising method 300 may be completed in any suitable order.

Method 300 may be implemented using a mobile device 101, control system 200, and/or any other system operable to implement method 300. In certain embodiments, method 300 may be implemented partially or fully in software and/or firmware embodied in computer-readable media.

The conditions set forth in steps 301A, 302, 303, 304, 305, and 306 above, that is, the magnitude of measured voltage signal $V_{MEAS}$ being below a threshold, the magnitude of measured current signal $I_{MEAS}$ or digital target current signal $I_{DIGITAL}$ being below a threshold, the slew rate of measured voltage signal $V_{MEAS}$ being above a threshold, the slew rate of measured current signal $I_{MEAS}$ or digital target current signal $I_{DIGITAL}$ being above a threshold, a slew rate of a supply voltage $V_{DD}$ being above a threshold voltage slew level, and supply voltage $V_{DD}$ being insufficient to provide digital target current signal $I_{DIGITAL}$, may be referred to as "accuracy-reducing events." In some embodiments, accuracy-reducing events used to determine whether to measure or suppress measurement of resistance may include only a subset of those accuracy-reducing events described above in steps 301A, 302, 303, 304, 305, and 306. In these and other embodiments, accuracy-reducing events used to determine whether to measure or suppress measurement of resistance may include one or more of those accuracy-reducing events described above in steps 301A, 302, 303, 304, 305, and 306, in addition to one or more accuracy-reducing events described above.

Figure 4:
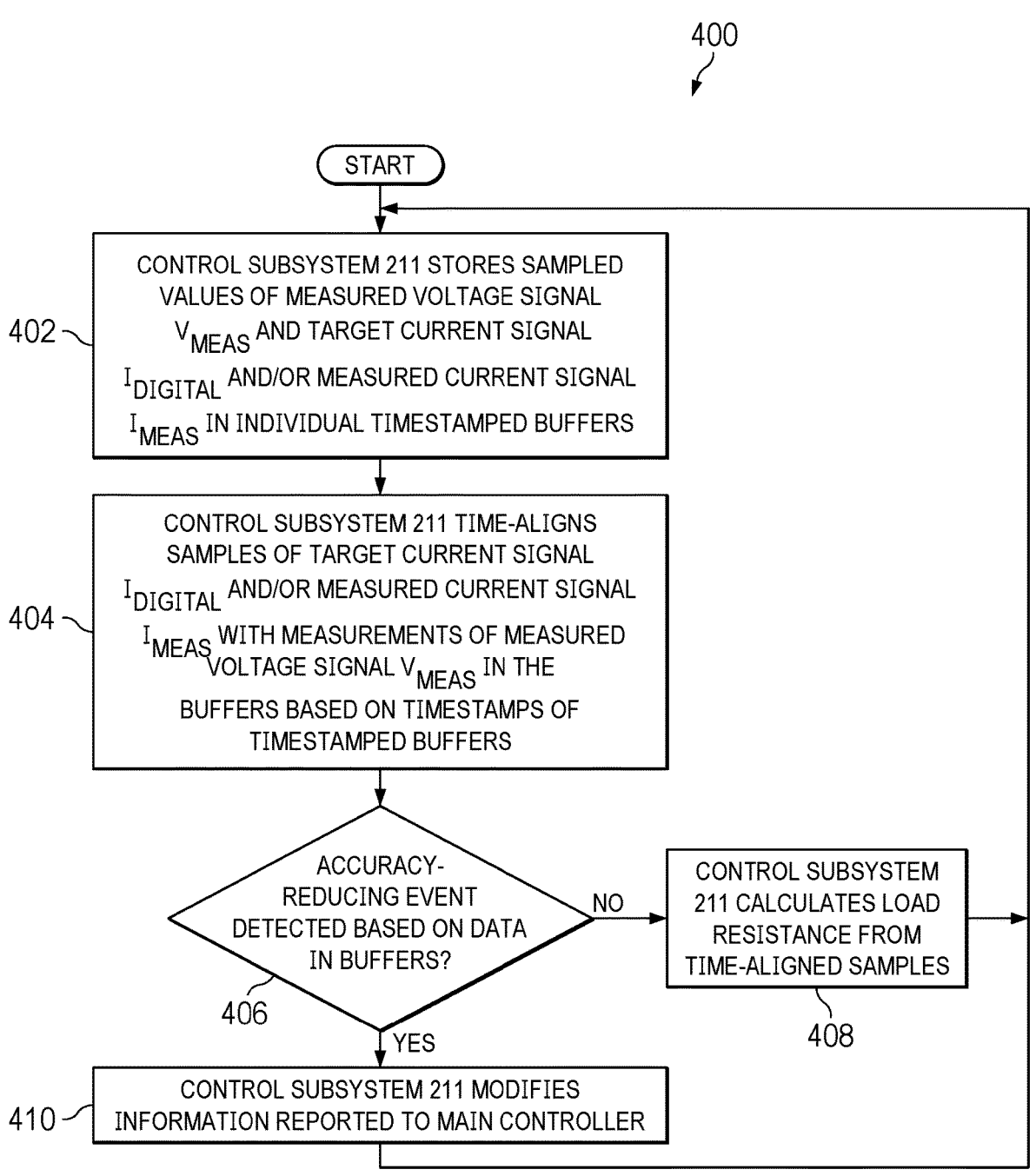
FIG. 4 illustrates a flow chart of an example method of calculating load resistance in the presence of asynchronous current and voltage data, in accordance with embodiments of the present disclosure.

FIG. 4 illustrates a flow chart of an example method 400 of calculating load resistance in the presence of asynchronous current and voltage data, in accordance with embodiments of the present disclosure. According to some embodiments, method 400 may begin at step 402. As noted above, teachings of the present disclosure may be implemented in a variety of configurations of mobile device 101 and/or control system 200. As such, the preferred initialization point for method 400 and the order of the steps comprising method 400 may depend on the implementation chosen.

At step 402, while generating target current signal $I_{DIGITAL}$ and measuring voltage signal $V_{MEAS}$ and current signal $I_{MEAS}$, control subsystem 211 may store sampled values of measured voltage signal $V_{MEAS}$ and target current signal $I_{DIGITAL}$ and/or measured current signal $I_{MEAS}$ in individual timestamped buffers. At step 404, control subsystem 211 may time-align the samples of target current signal $I_{DIGITAL}$ and/or measured current signal $I_{MEAS}$ with measurements of measured voltage signal $V_{MEAS}$ in the buffers based on timestamps of the timestamped buffers.

At step 406, control subsystem 211 may determine if accuracy-reducing events are present based on data in the buffers. For example, control subsystem 211 may detect the accuracy-reducing events of steps 302 and 304 of method 300 based on data stored in the buffers of samples of measured voltage signal $V_{MEAS}$. As another example, control subsystem 211 may detect the accuracy-reducing events of steps 303 and 305 of method 300 based on data stored in the buffers of samples of measured current signal $I_{MEAS}$ and/or target current signal $I_{DIGITAL}$. If accuracy-reducing events are absent, method 400 may proceed to step 408. Otherwise, if accuracy-reducing events are present, method 400 may proceed to step 410.

At step 408, control subsystem 211 may calculate load resistance from time-aligned samples using any one or more of a variety of methods known to those of skill in the art. After completion of step 408, method 400 may proceed again to step 402.

At step 410, control subsystem 211 may modify information it communicates in connection to calculation of resistance R. After completion of step 410, method 400 may proceed again to step 402.

Although FIG. 4 discloses a particular number of steps to be taken with respect to method 400, method 400 may be executed with greater or fewer steps than those depicted in FIG. 4. In addition, although FIG. 4 discloses a certain order of steps to be taken with respect to method 400, the steps comprising method 400 may be completed in any suitable order.

Method 400 may be implemented using a mobile device 101, control system 200, and/or any other system operable to implement method 400. In certain embodiments, method 400 may be implemented partially or fully in software and/or firmware embodied in computer-readable media.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
a first controller; and
a second controller communicatively coupled to the first controller via a bidirectional communication channel and configured to:
drive a load in accordance with a target current signal;
sample a load voltage of the load at a sample rate substantially slower than a time duration of electrical transients of the load;
calculate a resistance of the load based on a current signal and the load voltage and communicate information indicative of the resistance to the first controller at a time interval substantially slower than the time duration of electrical transients of the load;
detect when one or more accuracy-reducing events associated with the system occur, wherein an accuracy-reducing event is one which negatively affects accuracy of calculation of the resistance; and
modify the information provided to the first controller when one or more accuracy-reducing events occur.

2. The system of claim 1, wherein the current signal is the target current signal.

3. The system of claim 1, wherein the current signal is a measured load current signal indicative of current flowing through the load.

4. The system of claim 1, wherein the load comprises a mechanical actuator.

5. The system of claim 1, wherein the load comprises a motor.

6. The system of claim 1, wherein the one or more accuracy-reducing events comprises the load voltage being below a predetermined voltage threshold.

7. The system of claim 1, wherein the one or more accuracy-reducing events comprises a rate of change of the load voltage being above a predetermined voltage slew threshold.

8. The system of claim 1, wherein the one or more accuracy-reducing events comprises the current signal being below a predetermined current threshold.

9. The system of claim 1, wherein the one or more accuracy-reducing events comprises a rate of change of the current signal being above a predetermined current slew threshold.

10. The system of claim 1, wherein the one or more accuracy-reducing events comprises a supply voltage associated with the system being insufficient to drive the target current signal to the load.

11. The system of claim 10, wherein the second controller is further configured to:
detect the supply voltage being too low; and
modify the value of the target current signal to be realizable with the supply voltage available.

12. The system of claim 1, wherein the one or more accuracy-reducing events comprises a rate of change of the supply voltage being above a predetermined supply voltage slew threshold.

13. The system of claim 1, wherein detection of the one or more accuracy-reducing events is based on one or more of a system configuration, a desired load current, a load voltage measurement, or a load current measurement.

14. The system of claim 1, wherein modifying the information provided to the first controller comprises reporting a previous calculation of the resistance of the load.

15. The system of claim 1, wherein modifying the information provided to the first controller comprises reporting a default value of the resistance of the load.

16. The system of claim 1, wherein modifying the information provided to the first controller comprises reporting a zero value of the resistance of the load.

17. The system of claim 1, wherein modifying the information provided to the first controller comprises modifying one or more status flags.

18. The system of claim 1, wherein:

the current signal and measurement of the load voltage are asynchronous in time; and calculating the resistance of the load comprises:

storing values of the current signal and measurements of the load voltage in individual timestamped buffers; and time-aligning samples of the current signal with measurements of the load voltage in the timestamped buffers based on timestamps of the timestamped buffers.

19. The system of claim 18, wherein the second controller is further configured to evaluate data in the timestamped buffers to detect accuracy-reducing events.

20. A method, for a system comprising a first controller and a second controller communicatively coupled to the first controller via a bidirectional communication channel, the method comprising, by the second controller:

driving a load in accordance with a target current signal;

sampling a load voltage of the load at a sample rate substantially slower than a time duration of electrical transients of the load;

calculating a resistance of the load based on a current signal and the load voltage and communicate information indicative of the resistance to the first controller at a time interval substantially slower than the time duration of electrical transients of the load;

detecting when one or more accuracy-reducing events associated with the system occur, wherein an accuracy-reducing event is one which negatively affects accuracy of calculation of the resistance; and modifying the information provided to the first controller when one or more accuracy-reducing events occur.

21. The method of claim 20, wherein the current signal is the target current signal.

22. The method of claim 20, wherein the current signal is a measured load current signal indicative of current flowing through the load.

23. The method of claim 20, wherein the load comprises a mechanical actuator.

24. The method of claim 20, wherein the load comprises a motor.

25. The method of claim 20, wherein the one or more accuracy-reducing events comprises the load voltage being below a predetermined voltage threshold.

26. The method of claim 20, wherein the one or more accuracy-reducing events comprises a rate of change of the load voltage being above a predetermined voltage slew threshold.

27. The method of claim 20, wherein the one or more accuracy-reducing events comprises the current signal being below a predetermined current threshold.

28. The method of claim 20, wherein the one or more accuracy-reducing events comprises a rate of change of the current signal being above a predetermined current slew threshold.

29. The method of claim 20, wherein the one or more accuracy-reducing events comprises a supply voltage associated with the system being insufficient to drive the target current signal to the load.

30. The method of claim 29, further comprising the second controller:

detecting the supply voltage being too low; and modifying the value of the target current signal to be realizable with the supply voltage available.

31. The method of claim 20, wherein the one or more accuracy-reducing events comprises a rate of change of the supply voltage being above a predetermined supply voltage slew threshold.

32. The method of claim 20, wherein detection of the one or more accuracy-reducing events is based on one or more of a system configuration, a desired load current, a load voltage measurement, or a load current measurement.

33. The method of claim 20, wherein modifying the information provided to the first controller comprises reporting a previous calculation of the resistance of the load.

34. The method of claim 20, wherein modifying the information provided to the first controller comprises reporting a default value of the resistance of the load.

35. The method of claim 20, wherein modifying the information provided to the first controller comprises reporting a zero value of the resistance of the load.

36. The method of claim 20, wherein modifying the information provided to the first controller comprises modifying one or more status flags.

37. The method of claim 20, wherein:

the current signal and measurement of the load voltage are asynchronous in time; and calculating the resistance of the load comprises:

storing values of the current signal and measurements of the load voltage in individual timestamped buffers; and time-aligning samples of the current signal with measurements of the load voltage in the timestamped buffers based on timestamps of the timestamped buffers.

38. The method of claim 37, further comprising the second controller evaluating data in the timestamped buffers to detect accuracy-reducing events.

* * * * *